United States Patent [19]

Angell et al.

[11] Patent Number: 5,658,423

[45] Date of Patent: Aug. 19, 1997

[54] MONITORING AND CONTROLLING PLASMA PROCESSES VIA OPTICAL EMISSION USING PRINCIPAL COMPONENT ANALYSIS

[75] Inventors: David Angell, Poughkeepsie, N.Y.; Paul Bao-Luo Chou, Montvale, N.J.; Antonio Rogelio Lee, White Plains; Martin Clarence Sturzenbecker, Carmel, both of N.Y.

[73] Assignee: International Business Machines Corporation, Armonk, N.Y.

[21] Appl. No.: 563,172

[22] Filed: Nov. 27, 1995

[51] Int. Cl.$^6$ .................................................. H01L 21/00
[52] U.S. Cl. ................ 438/9; 204/192.13; 204/192.33; 356/316; 364/468.28
[58] Field of Search ......................... 156/626.1, 643.1; 427/8, 10; 356/72, 311, 316; 204/192.13, 192.33

[56] References Cited

U.S. PATENT DOCUMENTS

| | | | |
|---|---|---|---|
| 4,888,199 | 12/1989 | Felts et al. | 427/10 |
| 5,014,217 | 5/1991 | Savage | 364/498 |
| 5,040,734 | 8/1991 | Belchamber et al. | 241/30 |
| 5,114,233 | 5/1992 | Clark et al. | 356/354 |
| 5,121,337 | 6/1992 | Brown | 364/498 |
| 5,172,312 | 12/1992 | Lino et al. | 364/149 |
| 5,288,367 | 2/1994 | Angell et al. | 204/192.33 |
| 5,308,414 | 5/1994 | O'Neill et al. | 204/192.33 |
| 5,347,460 | 9/1994 | Gifford et al. | 204/192.33 |
| 5,442,562 | 8/1995 | Hopkins et al. | 364/468 |
| 5,467,883 | 11/1995 | Frye et al. | 156/626.1 |

FOREIGN PATENT DOCUMENTS

WO9321592A1 10/1993 WIPO.

OTHER PUBLICATIONS

Shadmehr et al. "Principal Component Analysis of Optical Emission Spectroscopy and Mass Spectroscopy: Application to Reactive Ion Etch Process Parameter Estimation Using Neural Networks" J. Electrochem. Soc. vol. 139, No. 3, pp 907–914. Mar. 1992.

Lee et al. "Prediction of Wafer State After Plasma Processing Using Real-Time Tool Data" IEEE Trans. Semicond. Manuf. vol. 8, No. 3, pp 252–261 Aug. 1995.

Fisher et al. "Techniques for Evaluating Control of Automated Multi-determinant Analytical Instruments by Computer" Analyst vol. 111, pp. 1225–1229, Nov. 1986.

Dose, V. "Multivariate Analysis of PECVD Data" Appl. Phys. A vol. A56, No. 6, pp. 471–477 Jun. 1993.

Chen et al. "Plasma etch modeling using optical emission spectroscopy" J. Vac. Sci. Tech. A vol. 14, No. 3, pp. 1901–1906, May 1996.

Tan et al. "Steady-state regression analysis and optimization of multivariable plasma etching system." IECON Proceedings (Industrial Electronics Conf.) vol. 3 pp. 1986–1991, 1994.

Wangmaneerat et al. "Plasma etching diagnostics for silicon nitride using emission spectroscopy and moltivariate calibration" Proc. –Electrochem. Soc. 92–18, pp. 115–126 1992.

P. Geladi, et al., "Partial Least-Squares Regression: A Tutorial" Analytica Chimica Acta. vol. 185, pp. 1–17, Elsevier Science Publishers, B.V., Amsterdam, The Netherlands, 1986.

*Primary Examiner*—R. Bruce Breneman
*Assistant Examiner*—Anita Alanko
*Attorney, Agent, or Firm*—H. Daniel Schnurmann

[57] ABSTRACT

A method of monitoring the status of plasma in a chamber using real-time spectral data while conducting an etch process during the course of manufacturing of semiconductor wafers. Spectral data is collected during etching, with the spectral data characterizing an emission of light from etch species contained in the plasma, and maintaining the collected data as reference data. A model of principal components of the data is generated. Additional spectral data is extracted from the plasma and compared with the model. Discrepancies pinpoint the presence of foreign material faults and help determine the cause of the failures to ensure appropriate corrective action.

18 Claims, 6 Drawing Sheets

MONITORING AND CONTROLLING PLASMA PROCESSES VIA OPTICAL EMISSION USING PRINCIPAL COMPONENT ANALYSIS

FIELD OF THE INVENTION

This invention relates, generally, to the fabrication of semiconductor wafers and chips and, more particularly, to monitoring and controlling various manufacturing process steps using digitized spectral data, e.g. optical emission, or mass spectra.

BACKGROUND OF THE INVENTION

Real time monitoring and control processes is becoming increasingly important in the manufacture of semiconductor integrated circuits (ICs). This trend is driven by the escalating number and complexity of process steps used during IC fabrication. As the number of process steps increases, the cost of mis-processing a wafer, likewise, also increases, demanding the use of effective diagnostic methods for prompt detection and identification of process problems.

The tools required to achieve precise monitoring routinely necessitate calibrating the most essential and crucial components, such as mass flow controllers, chamber pressure manometers, rf-power, chamber leak-up rate, and the like. The internal status of a plasma process is checked periodically (e.g., on a daily basis) by measuring etch rates on blanket wafers. Furthermore, etch rates and uniformity depend on a tool performing mechanically and chemically in the same internal plasma state as when the tool was initially qualified.

Many of today's processes, including Reactive-Ion-Etch (RIE) as well as other plasma-related processes, make use of sophisticated sensors such as Optical Emission Spectroscopy (OES) and Residual Gas Analysis (RGA). In such cases, the observed process data is composed of a time-series of multi-dimensional sensor readings. The dimensionality of the data involved can be quite large, specially when spectral instruments are used (e.g., OES and RGA which contain 1000 and 100 sensor readings, respectively). Interpretation of these time-series requires highly trained personnel, which has been a deterrent to using such systems in a manufacturing environment.

Handling spectral time-series data is preferably achieved by selecting a few variables a priori and monitoring their behavior as a function of time. This approach has been fully described in an article by S. B. Dolins et al., "Monitoring and Diagnosis of Plasma Etch Process", published in the IEEE Transactions on Semiconductor Manufacturing, Vol. 1, No. 1, February 1988. Statistical models can be built to characterize the temporal behavior of each selected channel. These models can be used to detect unusual conditions by comparing the actual behavior of the process to that predicted by the model and generating alarms based on the various methods (the simplest being using a threshold). There are several disadvantages with this approach:

1. Selecting a good set of variables to monitor is a non-trivial task. Typically, it is based on an ad-hoc selection procedure which may well differ from expert to expert.

2. Models must be built for each individual variable, a time-consuming effort which often leads to systems which only use a small subset of the variables that are measured, resulting in the loss of important information.

3. The selected variables are often cross-correlated. Monitoring such variables individually would be inefficient since the variables convey correlated information. However, monitoring a combined statistic of variables, as fully described by G. E. P. Box et al., in Time Series Analysis Forecasting and Control, published by Holden-Day, 2nd. Edition, San Francisco, 1976, may result in further loss of information.

By way of example, the "cleanliness" of a tool or a process is monitored by measuring the count of foreign material (FM) collected on a wafer passing through the tool. The presence of foreign material is a function of many factors, some of the most common being aging of the process kit components and polymer build-up on the chamber parts. Other methods for checking the performance of a tool include feedback from measurements performed on the product, some of which follow immediately after the wafer exits from the tool. Others may occur days or even weeks later. Whereas these monitoring procedures are usually effective, they do not provide by themselves an ironclad guaranty on the performance of a tool or process required for the manufacture of a product wafer. The aforementioned procedures oftentimes allow a faulty process to occur, which makes it essential to find yet better and more sophisticated approaches to avoid their occurrence. For instance, a small leak or similar disfunction in a constant gas flow may affect the etch profile or its selectivity, and may oftentimes not be detected by normal calibration. In a second example, an incomplete photoresist strip from a previous process step may bring a wafer into a chamber wherein the presence of resist may affect and completely alter the chemical composition of the plasma. The negative implications can be enormous and highly detrimental to the overall process. In yet a third example, an erroneous step may accidentally be used on a product wafer, of which there is little likelihood of recovery. Thus, prior art techniques are inadequate to ensure the proper monitoring and control of processing steps.

Reactive species, e.g., etchants or input gasses commonly used in the process of etching a film are known to be tracked utilizing a variety of techniques. One of the methods most often used tracks the intensity of a wavelength for a particular species using the aforementioned optical emission spectroscopy (OES). An example of how OES is used is described in U.S. Pat. No. 5,288,367 to Augell, and of common assignee, wherein a wavelength of light is used for end-point detection during etching. More particularly, OES is shown to track the amount of volatile etch products or reactive species as a function of film thickness. Spectral data is collected during the process which characterizes variations of light emitted by the discharges produced during etching. At least one principal component of the data is calculated, (hereinafter referred to as the eigenvalue). Each of the eigenvalues has variables, having each a weight. Each variable further corresponds to a given wavelength of the light emitted by the discharge. By examining the weights, it is determined which variables of the eigenvalues varies during the etch process, and the end-point of the etch can be detected by an analysis of the variable or the wavelength.

In U.S. Pat. No. 5,308,414 to O'Neil et al., and of common assignee, shows a method and apparatus for determining the time at which a plasma etching process should be terminated. As in the previously cited reference, the apparatus monitors the optical emission intensity of the plasma in a narrow band around a predetermined spectral band and generates a signal indicative of the spectral intensity of the etch product species. It additionally monitors the OES of the plasma in a wide band, generating another signal indicative of the spectral intensity of the continuum plasma emission. Based on these two signal, it generates a termination signal when the magnitudes diverge.

Prior art optical emission systems are commonly equipped with a photo-array detector having an output that covers the entire visible portion of the spectrum. At a typical sampling rate of 1 second, the data matrix becomes unmanageable in a very short period of time. The sizeable bulk of information is usually highly advantageous because it enables simultaneous observations of various key chemical species of an etch process. Nevertheless, full utilization of the entire data matrix at its high sampling rate cannot be accomplished in a real-time sense. Just to follow the time evolution of peaks and valleys of a spectrum can be instructive to some, but confusing to others. The goal is to utilize the entire spectrum, knowing beforehand that certain peaks are more critical to the etch process than others, and realizing that the intensity of peaks may naturally vary over an extended period of time in the course of an etch process. In practice, what is required in any fabrication line is a single display chart that quantitatively captures the temporal characteristics of multiple peaks and that allows for statistically meaningful control limits, sufficiently simple and easy for an operator to make a judgment on the state of a given process.

Various models can be built through the use of multivariate mathematical techniques to measure the status a plasma process based on OES inputs. These applications provide in real-time simple control charts with 3-sigma limits displaying the results of the model calculations. This process, hereinafter referred to as the "process guard", makes it possible to look in real-time at a plasma using OES. This process guard approach effectively locates faults and accurately pinpoints its source right at the outbreak of the problem. Whereas prior art OES has been mainly used as a "fingerprint" process, experts are routinely called to determine the cause of the problem. The process guard approach detects the presence of problems sufficiently early to minimize scrapping wafers and oftentimes it is instrumental in stopping the process when a serious fault occurs.

Linear algebra computations have been used successfully to separate correlated absorbance signals from spectral noise based on the aforementioned PCA technique, and has been combined with regression techniques to form the Principal Component Regression (PCR) used in conjunction with other statistical methods such as Partial Least Squares (PLS). An example of the use of these and other methods is fully described in U.S. Pat. No. 5,121,337 to Brown. This patent teaches how to correct the measured spectral data so that the data is substantially insensitive to measurement process signals. More particularly, it teaches a method for estimating unknown properties and/or compositional data of a sample which is insensitive to spectral data due to the measurement process itself.

Figure 1:
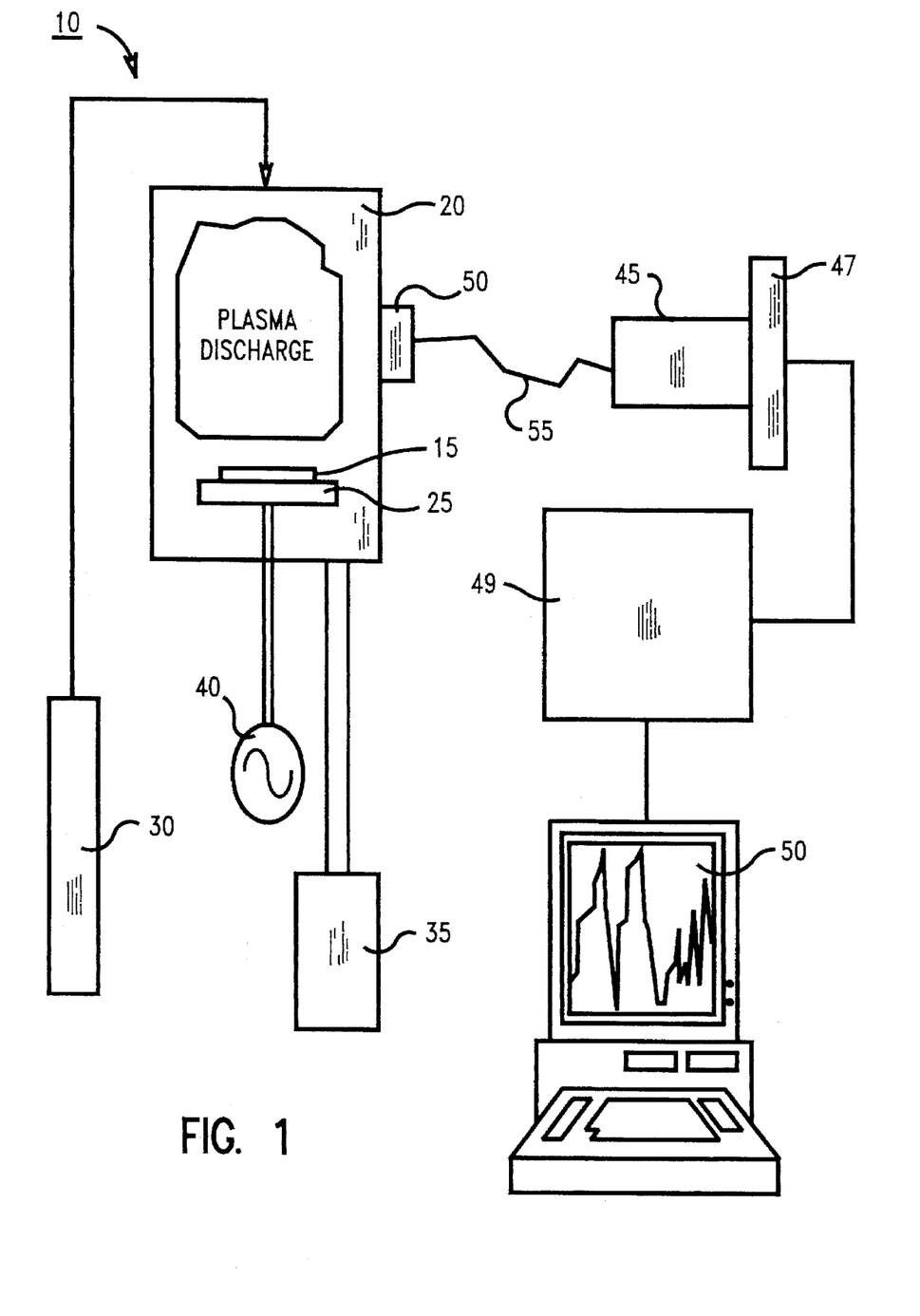
FIG. 1 shows a prior art block diagram of the major components of a typical apparatus used to monitor an etch process.

Referring now to FIG. 1, an apparatus described in U.S. Pat. No. 5,288,367 to Angell et al., and of common assignee, and known to the art for monitoring an etching process by selecting a wavelength of light, is shown as representative of the type normally used for implementing the method of monitoring and controlling a plasma process described in the present invention. The apparatus is specifically designed for end-point detection. Spectral data is collected during etching, which characterizes a variation of light emitted by discharge during the process. Eigenvalues of the data is collected, each having variables, each variable having a weight, and each variable further corresponding to a wavelength of the light emitted by the discharge. By examining and analyzing the weights, one may determine which variable of the eigenvalue varies during etching such that the end-point can be detected by monitoring the variable or the corresponding wavelength.

The major components of the RIE system assembly are a cathode 25 inside of a plasma chamber 20 filled with plasma. A gas supply 30 provides the necessary gas to the plasma inside the chamber 20, and a turbo pump 35 evacuates plasma discharge during etching. An RF generator 40 supplies RF power to the cathode 25 to form an RF field in the plasma. An OES 45 is attached to the plasma chamber 20 using port 50 via a fiber optic cable 55 to a photo-diode array detector/DAC (digital to analog converter) 47, referred to as a channel. The array/DAC detects and digitizes the emission signal so that a multi-channel analyzer 49 tracks and records the intensity of each wavelength of the light. Digitized spectral data is sent to a computer 50 for further processing. Additional details of the etching assembly can be obtained from the U.S. Pat. No. 5,288,367, which is herein incorporated by reference.

OBJECTS OF THE INVENTION

Accordingly, it is an object of the present invention to provide a monitoring system that pinpoints in real-time problems in a manufacturing process line.

It is another object of the invention to provide a method based on Principal Component Analysis (PCA) to characterize the normal "process space", i.e., defect process faults based on multi-dimensional process data.

It is yet a further object of the invention to create a model capable of monitoring a changing/dynamic process as found in plasma processing.

It is a more particular object of the invention to use residuals calculated from the PCA and the dynamic model analyses to infer the causes of the process faults.

It is still another object of the invention to have the monitoring system set in a standardized way such that operators may interpret results uniformly and without having to resort to experts.

It is a further object of the invention to provide real-time control charts having 3-sigma limits displaying the results of model calculations.

It is yet another object of the invention to use OES to detect the presence of a fault immediately at the outbreak of a processing problem.

It is a more particular object of the present invention to use the PCA model to characterize the normal process space based on the high-dimensional process data, such that catastrophic faults, e.g., gas leaks, can be reliably detected by the PCA model with simple calculations.

It is still another object of the invention to use multivariate mathematical techniques to provide temporal models of uncorrelated principal score variables derived from the PCA model to monitor the dynamic behavior of the process.

SUMMARY OF THE INVENTION

Accordingly, a method is provided for monitoring the status of a plasma using real-time spectral data obtained while conducting an etch process in the course of manufacturing a semiconductor wafer, the method includes the steps of: collecting spectral data during the etch process from the plasma, the spectral data characterizing an emission of light from etch species contained in the plasma, the collected data representing reference data; generating a model of the principal components contained in the collected spectral data; and subsequently extracting from the plasma additional spectral data for comparison with the model, such that discrepancies between the reference spectral data and the subsequently extracted data pinpoint the presence of foreign material faults, thereby determining the status of said etch process.

BRIEF DESCRIPTION OF THE DRAWINGS

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings.

DETAILED DESCRIPTION OF THE INVENTION

Figure 2A:
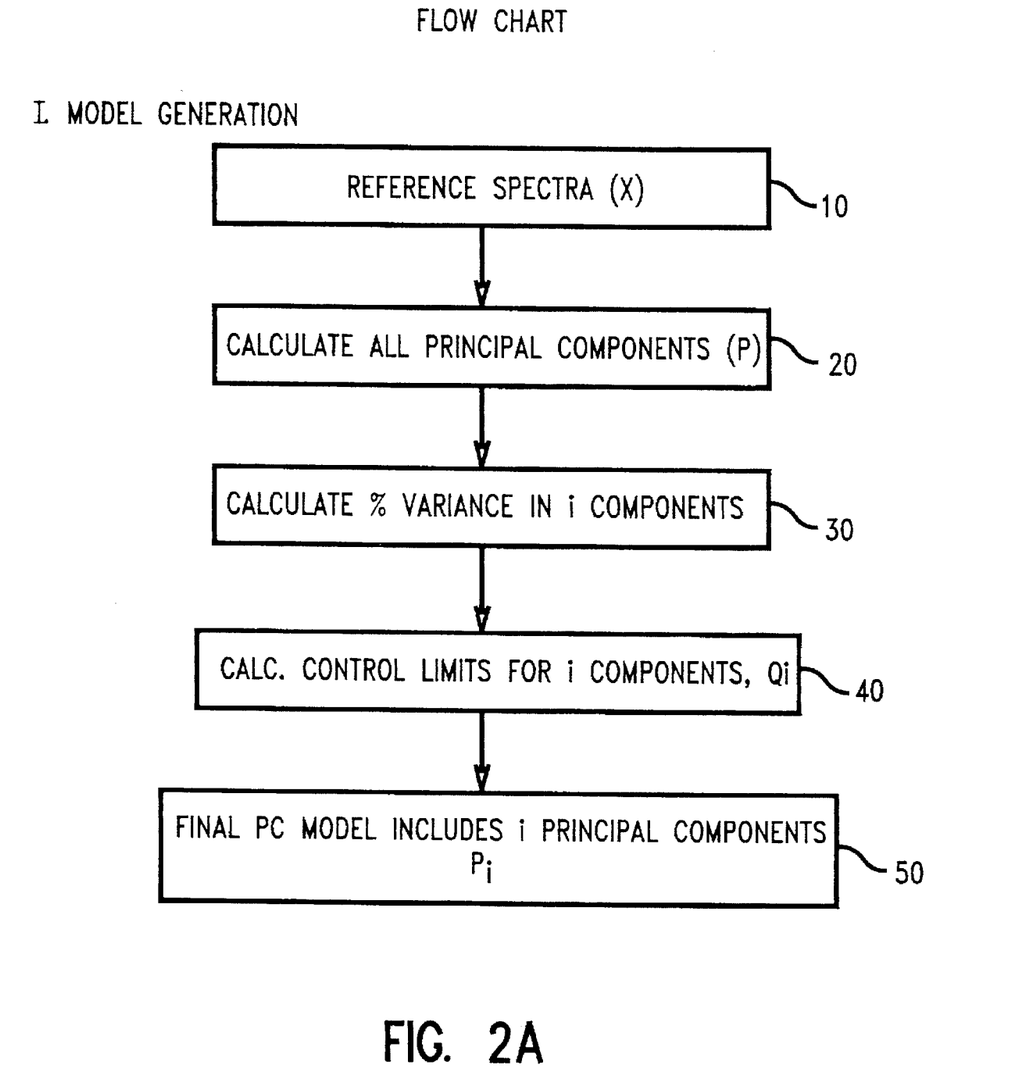
FIG. 2A is a flow chart showing the various steps that describe building a model, in accordance with the present invention.
Figure 2B:
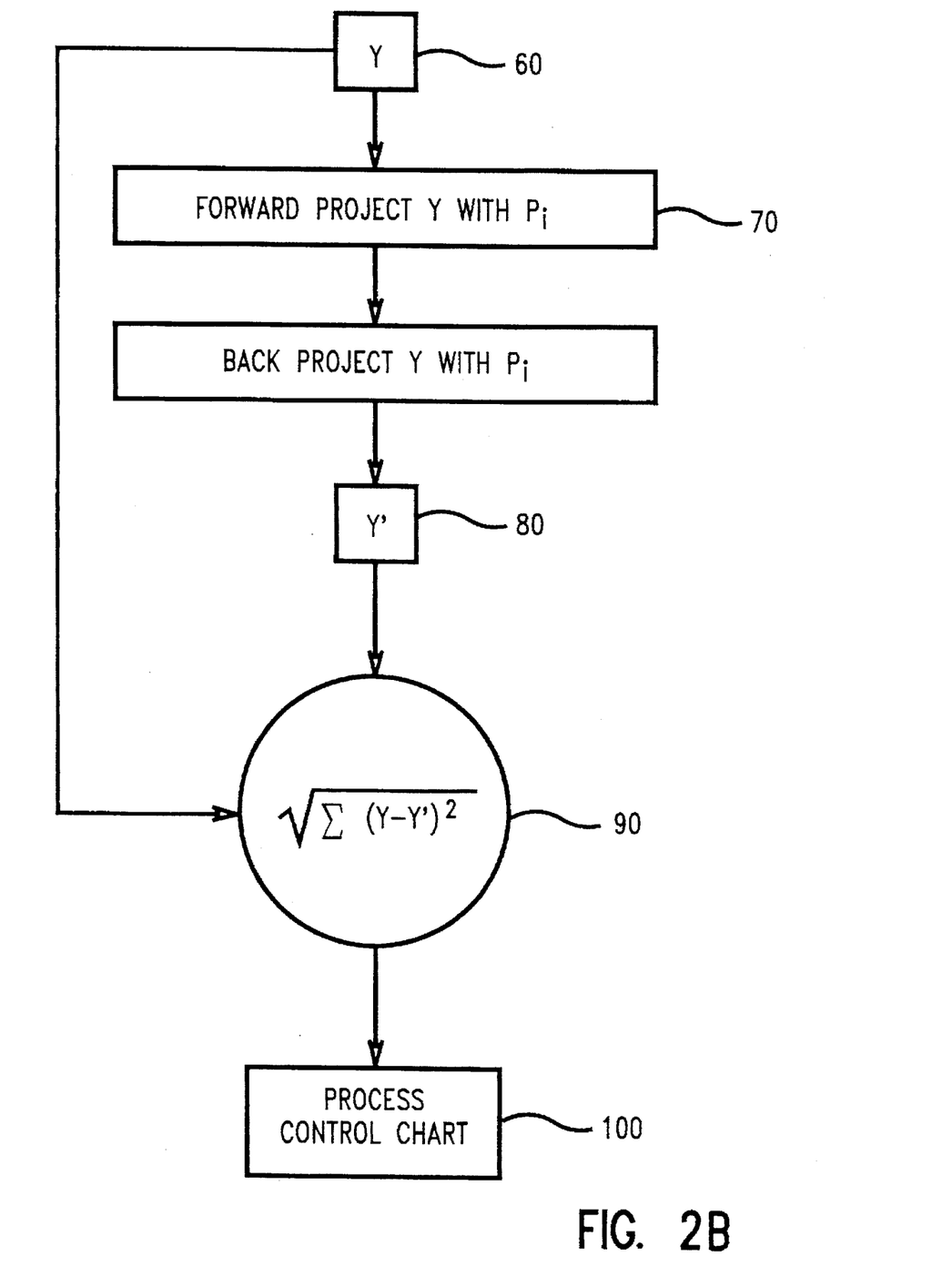
FIG. 2B is a flow chart that uses the model generated in FIG. 2A for monitoring the process in real-time, in accordance with the present invention.

Reference is now made to the flow chart process described in FIG. 2A that shows the various steps that describe building a model, and to FIG. 2B, a flow chart that uses the model generated in FIG. 2A for monitoring the process in real-time.

Calculation of Model (Model Generation)

The first step 10 consists in collecting reference spectra data X from a process.

Principal Component Analysis (20)

Principal Component Analysis is a method of writing a matrix, such as matrix X, in terms of its principal vectors, also referred to as principal component. Although other methods exist, there are three techniques most commonly used for computing the principal components. Eigenanalysis of the covariance or correlation matrix of X, singular value decomposition (SVD) of X, and nonlinear partial least squares (NIPALS) of X. A short discussion on singular value decomposition SVD is presented herein, as the preferred method to be used for principal component calculation. Let X be an n by q matrix, which in practice is a set of so-called spectra taken as a function of time during an etch process. It is assumed that the process is known to be stable, optimized, and that all performance factors are good. Each new time sample is a new row in X. Through SVD, X is decomposed into a sum of rank-1 matrices $$x = \sum_{i=1}^{9} \alpha_i u_i p_i'$$

wherein $\alpha$ are the singular values of x, and u, p are called the left and right singular vectors. Seen from another perspective, SVD is to a rectangular matrix what eigenanalysis is to a square matrix. From an eigen-analysis of the covariance matrix of X (a square matrix) that is performed, a set of eigenvalues and eigenvectors are generated. The singular values of an SVD analysis are the square root of the eigenvalues obtained by the eigen-analysis and the p right singular vectors are equivalent to the eigenvectors. By collecting the separate $\alpha$'s into a diagonal matrix A, and repeating the same for u and p, the SVD of X can be written in matrix notation as:

$$X = UAP'$$

Calculate Percent Variation Included in I Principal Components (30)

In this decomposition, the best rank-1 approximation to X is calculated from the u and p of the largest singular value. The best rank-2 approximation is the sum of the u and p associated with the first and second largest singular values, and so on. The closeness of this approximation to the original matrix X is evaluated by:

$$\frac{\alpha_1^2}{\Sigma \alpha_i^2}$$

and $$\frac{(\alpha_1^2 + \alpha_2^2)}{\Sigma \alpha_i^2}$$

In practice, this number is important in assessing the number of p vectors to be incorporated in the principal component model. Geometrically, if it is found that 90% of the variance in a data set is retained by two singular values (and therefore, two eigenvectors), it follows that the dispersion of the cloud of points in the original n-dimensional space is contained within two dimensions. That is to say that 90% of the points falls on a single plane.

Confidence Limits for the PCA Model (40)

Approximate confidence limits on Q can be calculated by the following equation:

$$\Theta_k = \Theta_1 \left[ c_k \frac{\sqrt{2 \Theta_2 h_0^2}}{\Theta_1} + 1 + \Theta_2 \frac{h_0(h_0-1)}{\Theta_1^2} \right]^{\frac{1}{h_0}}$$

wherein:

$c_k$ is the normal deviate corresponding to the upper (1-k) percentile, k=2, 3, 4, and wherein $$\Theta_i = \sum_{d=m+1}^{9} (\alpha_j^2)^i$$

for i=1, 2, 3. $\Theta_i$ is the sum of the eigenvalues not used in the model taken to the $i^{th}$ power; and $$h_0 = 1 - \frac{2\Theta_1\Theta_3}{3\Theta_2^2}$$

Final PCA Model (50)

In a principal component analysis, a matrix T=XP is generated where P are, as previously defined, the right singular vectors of X, also referred to as the principal component loadings. The columns of T are called the principal component scores. This linear transformation is a projection of X onto the subspace defined by the columns of P. P is referred as the model (50).

Real-Time Monitoring With PCA Model

Collecting Real Time Spectra from the Process (60)

Where Y is a matrix of real-time spectra, with columns representing the variables, the rows time-samples the process.

Forward Projection of Y (70).

When a real-time, single sample, spectra Y is inputted into the model, the first step consist in projecting the data using the model P.

$$\hat{T} = YP$$

Backward Projection of T (80)

The second step is to reverse this procedure, using the same principal component loadings. This step attempts to reconstruct the original Y by back projection.

$$Y' = \hat{T}P'$$

Comparison of real-time data to the principal component model is then achieved by calculation of the residuals.

Calculation of the Residual R (90)

$$R = \sqrt{\Sigma (Y - Y')^2}$$

The size of the residuals depends on how different Y is from X in the sense that the loadings are derived from the principal component analysis of X. This implies that the model P is only good at projection and reconstruction of spectra similar to those found in X.

Display of Results in a Control Chart Format (100)

When the control limit Q is exceeded, it is known to be attributed to a variation other than noise, or a non-systematic variation.

Figure 3:
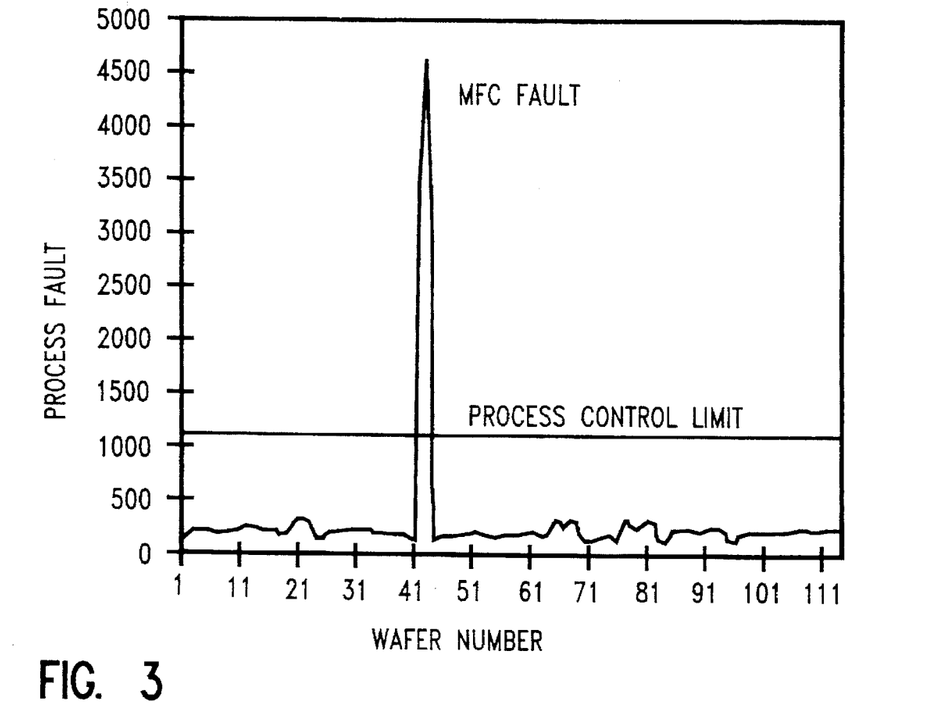
FIG. 3 shows the process guard control chart highlighting the presence of an MFC (mass flow controller) when process faults are plotted against the number of wafers.
Figure 4:
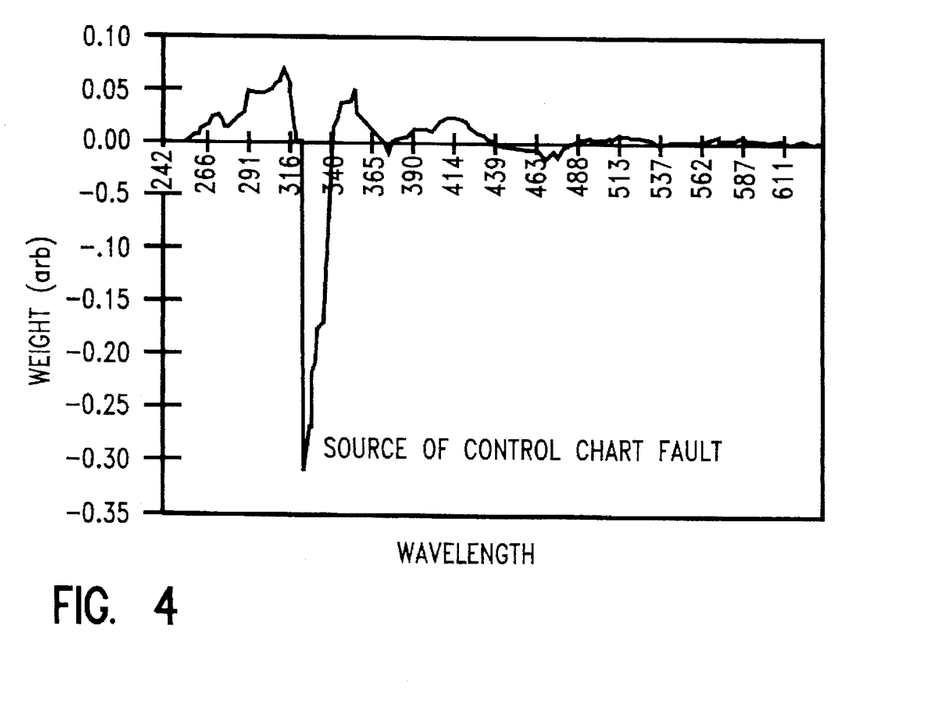
FIG. 4 shows a chart of a model weight, wherein weight is plotted against wavelength to identify the wavelength range bracketing a fault.
Figure 5:
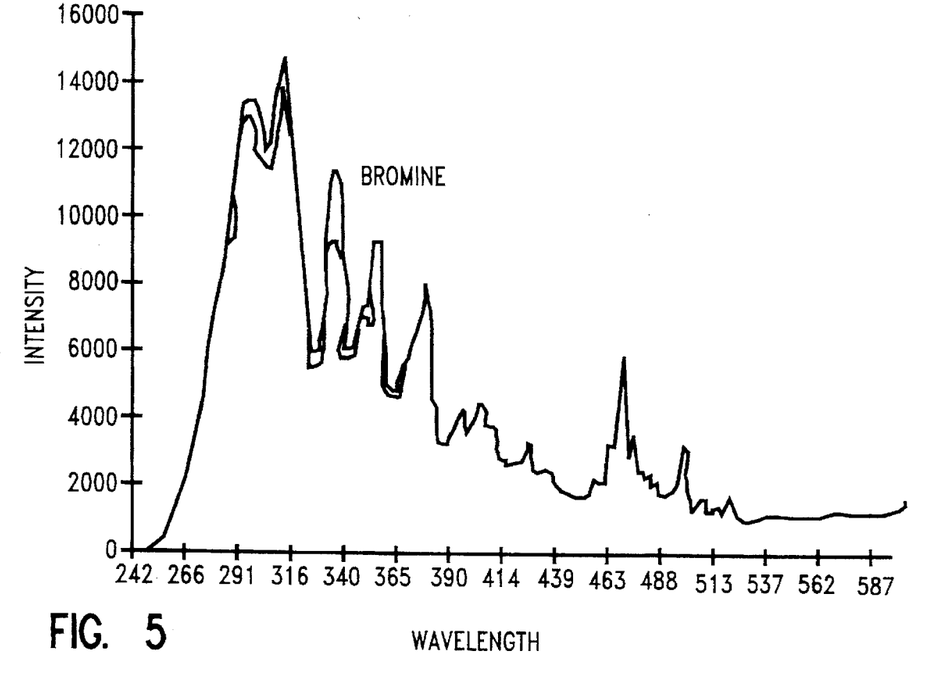
FIG. 5 illustrates a composite plot showing the intensity of a fault spectra compared to that of a reference spectra.

Referring now to FIG. 3, it is shown a process guard control plot typical of a silicon etch process. The spectra are gathered during the etch of several hundred wafers using the same tool and the same process. Shown between 41 and 51 wafers, an impulse waveform shows the presence of a fault, which is due to a sudden change in the OES spectra. To determine the probable cause of the failure, reference is made to FIG. 4 in which an applicable process guard model is used. Shown on FIG. 4 is a model weight plotted against wavelength, pinpointing the source of the fault. For the wafer having the fault condition, the region showing the maximum and minimum values corresponds to the portion of the spectra that varies the most with respect to the reference spectra. The weight chart x-axis corresponds to the wavelength so that by looking at the actual spectra taken during the occurrence of the fault, the spectra bracketed by this range of wavelengths requires further examination. By comparing the intensity of the fault spectra of a reference spectra to that obtained from the chamber, one may determine referring to FIG. 5 that the fault spectra in the vicinity of 330 nm. is significantly less than that of the reference spectra. Practitioners of the art will readily realize that at this resolution, certain species identifications will remain doubtful, although a strong correlation may be made pointing out that a strong bromine peak in that region may be the cause of the problem. With this indication in mind, it becomes possible to assert with a certain level of confidence the origin of the problem and replace if applicable, e.g., a bromine mass flow controller which may as a result of these observation, failed its calibration test.

Figure 6:
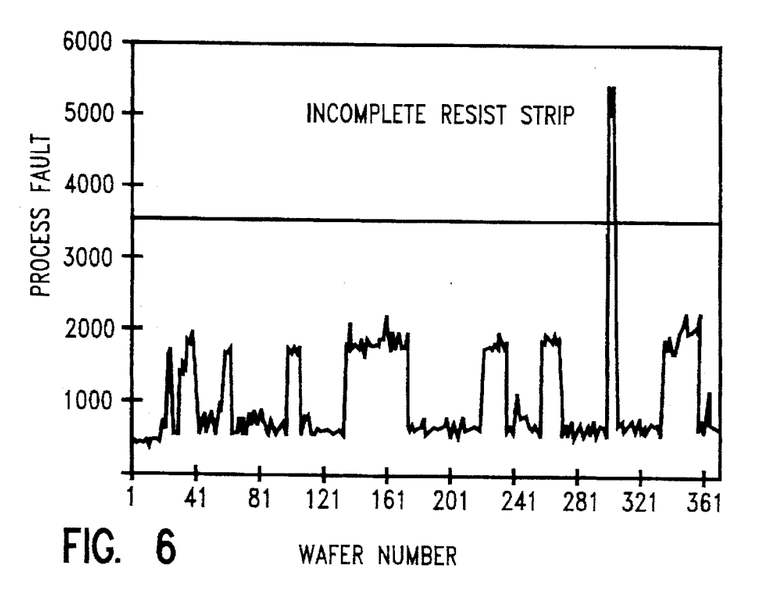
FIG. 6 shows a process guard control chart for an integrated etch process using three separate chambers within a single tool.

In a second example, illustrated in FIG. 6, a process guard control plot is shown for an integrated etch process. In this etch, three separate chambers of the same tool mainframe is used. Each wafer from the lot goes into the chamber in a predetermined order. A mask etch is performed in chamber 1, a photoresist operation, in chamber 2, and a poly-silicon, in chamber 3. From the control chart illustrated in FIG. 6, is shown what appears to look like a noisy trace accentuated by a definite fault. Actually, there are two different product levels of this tool having identical chemistries but different pattern factors. The regions identified by A and B represent different product levels. They show the sensitivity of the process guard technique to differences in product type. A filter may oftentimes be advantageously used to select a particular type of etch and product in the tool. Subsequently, the correct reference model is loaded to perform real-time monitoring. The fault illustrated in FIG. 6 is the result of an incomplete strip of photo-resist in the second chamber. Wafers entering the third step of the etch process with the aforementioned resist on the surface display a significant change in the chemistry of the etch. The poly-silicon etch rate is shown to drop substantially to one-half its original value. This third step being a timed-etch did result in an incomplete opening of the feature.

Figure 7:
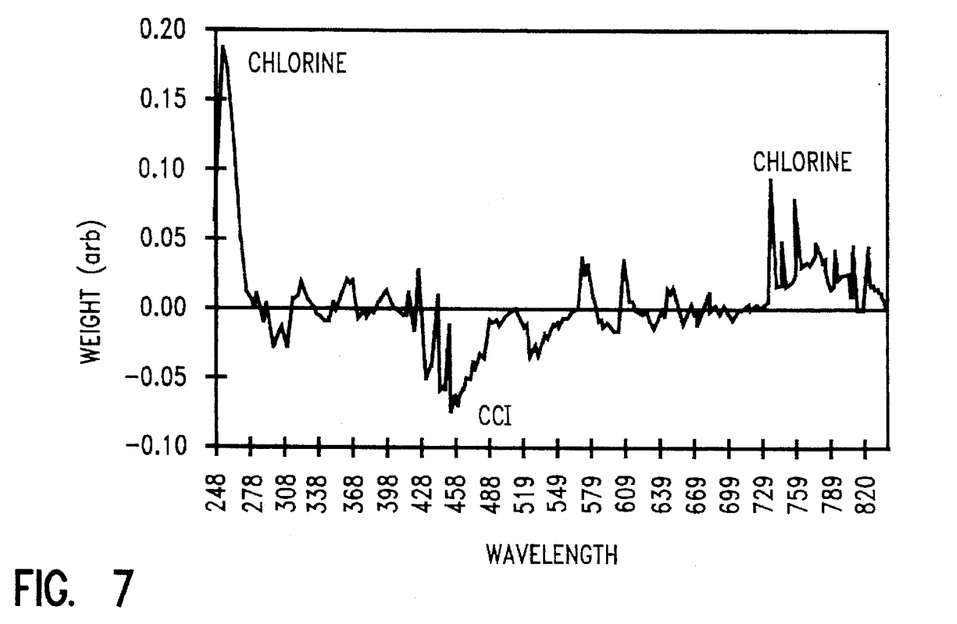
FIG. 7 illustrates the corresponding model weight plotted against wavelength, similar to the plot shown in FIG. 6.

An examination of the model weights (FIG. 7) shows a strong maximum at around 256 nm., with several peaks occurring in the 700 nm. region. For the chemistry of this etch, the most likely candidate at 256 nm. is Cl2, although other peaks also appear at 726, 741, 755 and 775 nm. At the minimum, located around 400 nm., there is known to be a broad band continuum for CCl as described by R. W. B. Pearse and A. G. Gaydon, in The Identification of Molecular Spectra, published by Chapman & Hall, 4th. Edition, London, 1976. Upon examination of the actual spectra (not shown), one may notice a drop in Cl2 and an increase in CCl. Apparently, the Cl2 that normally etches the poly-silicon was consumed by the extra carbon in the photoresist on the surface of the wafer. Without the normal concentration in the plasma, the silicon etch rate that is expected would drop significantly.

Figure 8:
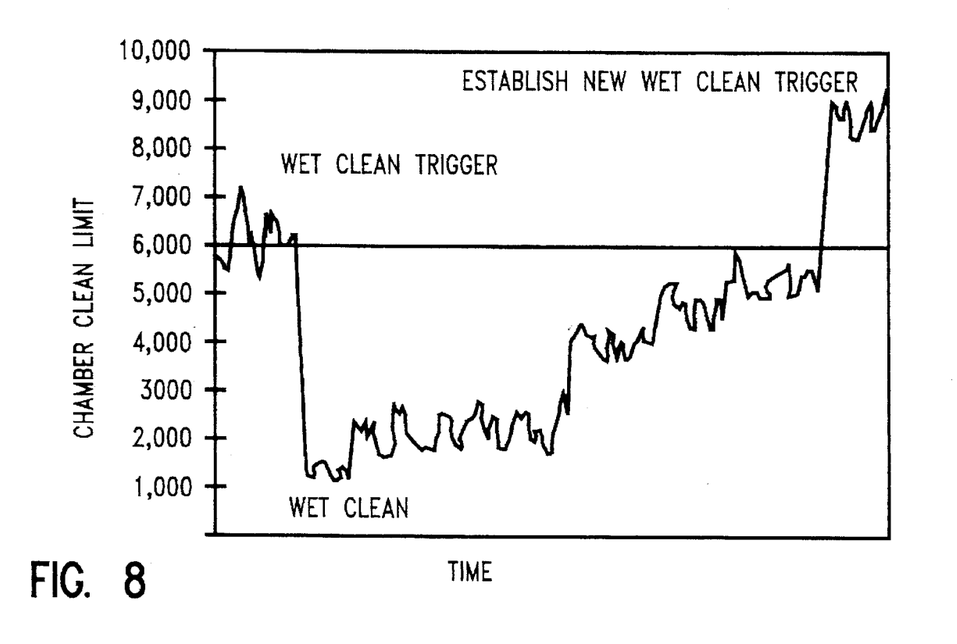
FIG. 8 illustrates a control chart generated to measure the "cleanliness" of an oxide etch chamber.

In a final example, illustrated in FIG. 8, archived data is analyzed to measure chamber cleanliness. OES spectra for an oxide etch chamber was gathered periodically from a point in time immediately preceding a wet clean operation and extending until the next occurrence of the wet clean. In between the two cleans different types of product etch were etched in the chamber. The data collected for the present example was always sampled for the same type of product wafer. A control chart is generated by first gathering data from the first product lot through the tool just after the wet clean was used as reference data. The entire data set was then inputted into the process guard with results shown in FIG. 8. A minimum value of the trace occurs when the chamber was cleaned. It reaches a high value just prior to the next wet clean. In between two cleans, the value increases over time. A control limit, set for reference, is drawn at a level just prior the last wet clean. The steps in the rising part of the trace are caused by non-linearities occurring, e.g., when different number of wafers are processed between sampling. The fact that the value of the limit increases beyond the previous maximum level is caused by a search of a new clean trigger for that particular chamber. Thus, one may conclude that it is possible to determine a wet trigger without waiting for an etch uniformity or FM failure.

The method described above has been successfully used for detecting a variety of faults in the etch process. These include: detecting the presence of foreign materials; prior etching steps that were misprocessed; faulty equipment, such as mass flow controllers; the presence of chamber leaks into the atmosphere; poorly calibrated chamber control sensors; chamber wall conditioning; processing of wrong wafers in the etch chamber; and even detecting a condition pinpointing to a previously etch process that was erroneously replicated. These were found by the presence of gases other than those defined in the model or by the presence of the same gases as in the model but in ratios others than those originally defined.

Whereas the invention has been described in terms of specific embodiments and illustrations, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method for monitoring the status of a plasma using real-time spectral data obtained while conducting an etch process in the course of manufacturing a semiconductor wafer, said method comprising the steps of:
   a) collecting said spectral data during said etch process from said plasma;
   b) calculating principal components of said collected spectral data and determining a control limit characteristic of said etch process;
   c) extracting from said plasma additional spectral data;
   d) forwardly, and subsequently backwardly projecting said forwardly projected additional spectral data utilizing said principal components;
   e) subtracting said additional spectral data from said backwardly projected data, resulting in a data set of residuals; and
   f) combining said residuals and comparing said combined residuals to said control limits, wherein
   a fault in said etch process is detected when the result of said comparison exceeds said control limit.

2. The method as recited in step b) of claim 1, wherein said principal components characterize the relative importance of etch species contained in said spectral data.

3. The method as recited in step b) of claim 1, further comprising the step of calculating a percentage variation of selected samples of said spectral data.

4. A method for monitoring an etch process in the course of manufacturing a semiconductor integrated circuit wafer comprising the steps:
   loading the wafer into a etch chamber;
   filling said chamber with etch gases in a controlled environment;
   igniting said etch gases by applying RF-power to said gases, thereby establishing a plasma within said chamber;
   simultaneously collecting spectral data, wherein said collected data constitutes a reference data set;
   generating principal components from said reference data set;
   determining, with said reference data, a process control limit that defines, a safe operating window for said etch process;
   subsequently, collecting from said plasma additional spectral data;
   forwardly, and subsequently backwardly projecting said forwardly projected additional spectral data utilizing said principal components;
   subtracting said additional spectral data from said backwardly projected data, resulting in a data set of residuals; and
   combining said residuals and comparing said combined residuals to said control limit, wherein
   a fault in said etch process is detected when the result of said comparison exceeds said control limit.

5. The method as recited in claim 4, wherein said fault in said process is characterized by a value defining an intensity of an emission of light from species not originally contained in said reference data set.

6. The method as recited in claims 4, wherein said fault in said process is characterized by a value defining an intensity of an emission of light from species originally contained in said reference data set but having different ratios.

7. The method as recited in claim 4, wherein said fault in said process is characterized by a value defining an intensity of said emission of light from species originally contained in said reference data set and having a same ratios, but wherein said ratio changes over time.

8. The method as recited in claim 4, wherein said faults in said etch process are selected from a group that consists of a presence of foreign material, a prior processing step that was misprocessed, a faulty mass flow controller, a leaky chamber, a poorly calibrated chamber control sensor, chamber wall conditioning, processing of a wrong wafer in said chamber, and replicating a previous etch process.

9. The method as recited in step a) of claim 1, wherein said collected data represents reference spectral data.

10. The method as recited in claim 9, wherein discrepancies between said reference spectral data and said additional spectral data pinpoints the presence of said fault in said process.

11. The method as recited in step b) of claim 1, further comprising the step of generating a model, utilizing said spectral data.

12. The method as recited in claim 1, wherein said spectral data characterizes an emission of light generated within said plasma.

13. The method as recited in step d) of claim 1, wherein said forwardly and backwardly projection of said additional spectral data is achieved by matrix multiplication.

14. A method for monitoring the status of a plasma using real-time spectral data obtained while conducting an etch process, said method comprising the steps of:

a) collecting said real-time spectral data from said plasma;
b) calculating principal components of said collected spectral data and a control limit indicative of said etch process;
c) while further conducting said etch process, collecting new spectral data from said plasma;
d) forward projecting said new spectral data utilizing said principal components;
e) backwardly projecting said forwardly projected data, utilizing said principal components;
f) calculating residuals by subtracting said new spectral data from said backwardly projected data;
g) combining said residuals, resulting in a residual value; and
h) comparing said resultant residual value to said control limit, wherein the result of said comparison exceeding said control limit constitutes a fault in said etch process.

15. The method as recited in step b) of claim 14, wherein said principal components characterize the relative importance of each etch specie contained in said real time spectral data.

16. The method as recited in step b) of claim 14, further comprising the step of calculating a percentage variation of selected samples of said new spectral data.

17. The method as recited in step g) of claim 14, wherein combining said residuals includes adding said residuals.

18. The method as recited in step g) of claim 14, wherein combining said residuals includes taking the square root of the difference of the squares of said residuals.

* * * * *